(12) United States Patent
Chen et al.

(10) Patent No.: US 11,087,820 B2
(45) Date of Patent: Aug. 10, 2021

(54) SYSTEMS AND METHODS FOR PLATE VOLTAGE REGULATION DURING MEMORY ARRAY ACCESS

(71) Applicant: Micron Technology, Inc., Boise, ID (US)

(72) Inventors: Yu-Feng Chen, Plano, TX (US); Byung S. Moon, Plano, TX (US); Myung Ho Bae, McKinney, TX (US); Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 16/556,763

(22) Filed: Aug. 30, 2019

(65) Prior Publication Data

US 2019/0392887 A1    Dec. 26, 2019

Related U.S. Application Data

(63) Continuation of application No. 15/833,713, filed on Dec. 6, 2017, now Pat. No. 10,497,424.

(51) Int. Cl.
| | |
|---|---|
| *G11C 11/4074* | (2006.01) |
| *G11C 11/408* | (2006.01) |
| *G06F 13/42* | (2006.01) |
| *G11C 11/4094* | (2006.01) |
| *G11C 8/12* | (2006.01) |

(52) U.S. Cl.
CPC ...... *G11C 11/4074* (2013.01); *G06F 13/4243* (2013.01); *G11C 11/4085* (2013.01); *G11C 11/4094* (2013.01); *G11C 8/12* (2013.01)

(58) Field of Classification Search
None
See application file for complete search history.

(56) References Cited

U.S. PATENT DOCUMENTS

| | | |
|---|---|---|
| 8,209,458 B1 | 6/2012 | Keren et al. |
| 2001/0021119 A1 | 9/2001 | Kawasumi |
| 2015/0194222 A1 | 6/2015 | Kanda |
| 2017/0289850 A1 | 10/2017 | Nale et al. |
| 2018/0039429 A1 | 2/2018 | Wu et al. |
| 2018/0090201 A1 | 3/2018 | Wu |
| 2018/0181336 A1 | 6/2018 | Lovelace et al. |
| 2019/0050284 A1 | 2/2019 | Brown |

*Primary Examiner* — Charles Rones
*Assistant Examiner* — Ryan Dare
(74) *Attorney, Agent, or Firm* — Fletcher Yoder, P.C.

(57) ABSTRACT

A memory device may include a memory array comprising at least two sections. Each of the sections may further include multiple memory cells. The memory device may also include one or more controllers designed to receive one or more commands to initiate writing logical data to the multiple memory cells of a first section and a second section. Additionally, the writing may alternate between the first section and the second section until the first section and second section have been entirely written with the logical data.

24 Claims, 7 Drawing Sheets

SYSTEMS AND METHODS FOR PLATE VOLTAGE REGULATION DURING MEMORY ARRAY ACCESS

This application is a continuation of U.S. patent application Ser. No. 15/833,713, which is entitled "SYSTEMS AND METHODS FOR PLATE VOLTAGE REGULATION DURING MEMORY ARRAY ACCESS," filed Dec. 6, 2017, which is incorporated by reference herein in its entirety for all purposes.

BACKGROUND

Embodiments described herein relate generally to the field of memory devices. More specifically, the current embodiments include one or more systems, devices, and methods for minimizing current draw when writing to a memory array.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Various modes of operation in memory devices may require access to large sections or all of the memory array on the memory device. For example, in certain instances, such as testing, the memory device may be set to a mode such that each memory cell of the memory array may be individually accessed and/or written to. The accessing of each memory cell in certain modes of operation may be an iterative process such that each of the memory cells in the memory array is sequentially accessed. In order to facilitate such functionality, it may be desirable to provide fast and efficient methods and structures for allowing access to each memory cell in a sequential manner and writing logical data (i.e., 1s and 0s). Additionally, writing the logical data to multiple memory cells quickly may increase current draw. Accordingly, embodiments described herein may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, it may be desirable to read/write a specific set or pattern of logic (e.g., 1s and 0s) in a memory array. In doing so, memory devices may employ modes of operation that facilitate sequential access to all memory cells or large blocks of memory cells in a memory array. For instance, in double data rate type five synchronous dynamic random access memory (DDR5 SDRAM), certain modes of operation, such as Fast Zero mode, provide that each cell of the memory array is sequentially accessed and written. As will be appreciated, sequential access may be characterized by any rational sequence (e.g., [0, 1, 2, 3 . . . ], [1, 3, 5, 7 . . . ], etc.).

In one embodiment, Fast Zero mode may be utilized to quickly write logical zeros to all or part of the memory array with or without using an input/output interface for each write. In order to sequentially access each memory cell, one or more commands may be received by the memory device. Controllers in the memory device may be used to generate internal memory addresses such that each cell can be individually accessed. One or more counters may be used to sequence through internal addresses to access each memory cell of the array. Because multiple memory cells may be written with the same logical data (e.g., a logical 0), the plate voltage of the memory array may also be driven away from its reference point (e.g., one half the memory array supply voltage). Thus, current may be sinked or sourced accordingly to maintain the reference voltage. In some embodiments, normal write operations may draw less than or about 1 milliamp (mA). However, during Fast Zero mode, this current demand may be many times greater. By sequencing the write operations to alternate between sections of opposite polarity, the current demand may be reduced.

Figure 1:
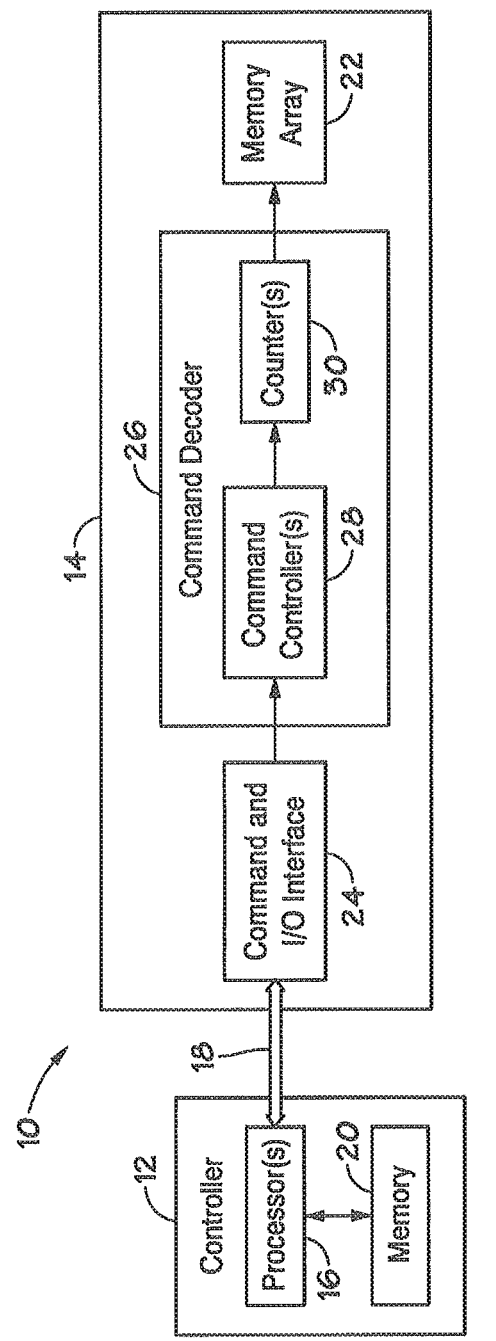
FIG. 1 is a block diagram illustrating a computer system, in accordance with an embodiment of the present disclosure.

Referring now to FIG. 1, a simplified block diagram of a computer system 10, which may provide for such sequential access of a memory device, is illustrated. The computer system 10 includes a controller 12 and a memory device 14. The controller 12 may include processing circuitry, such as one or more processors 16 (e.g., one or more microprocessors), that may execute software programs to provide various signals to the memory device 14 over one or more bi-directional communication buses 18 to facilitate the transmission and receipt of data to be written to or read from the memory device 14. Moreover, the processor(s) 16 may include multiple microprocessors, one or more "general-purpose" microprocessors, one or more special-purpose microprocessors, and/or one or more application specific integrated circuits (ASICS), or some combination thereof. For example, the processor(s) 16 may include one or more reduced instruction set (RISC) processors.

The processor(s) 16 may be coupled to one or more memories 20 that may store information such as control logic and/or software, look up tables, configuration data, etc. In some embodiments, the processor(s) 16 and/or the memory 20 may be external to the controller 12. The memory 20 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 20 may store a variety of information and may be used for various purposes. For example, the memory 20 may store machine-readable and/or processor-executable instructions (e.g., firmware or software) for the processor(s) 16 to execute, such as instructions for providing various signals and commands to the memory device 14 to facilitate the transmission and receipt of data to be written to or read from the memory device 14.

The memory device 14 includes a memory array 22 of individual memory cells. As described further below, the memory array 22 may include one or more memory banks that may be grouped or partitioned in a variety of ways to provide access to the cells of the memory array 22, as described below. The controller 12 may communicate with the memory device 14 through one or more command and input/output (I/O) interfaces 24. In general, the command and input/output interfaces 24 provide access to various components of the memory device 14 by external devices, such as the controller 12.

The memory device 14 may include a command decoder 26. The command decoder 26 may receive command signals from the command and input/output (I/O) interfaces 24 and may decode the command signals to provide various internal commands. For instance, the command decoder 26 may decode commands, such as read commands, write commands, mode-register set commands, activate commands, etc., and provide access to specified regions of the memory array 22. As described above, certain modes of operation, such as the Fast Zero mode, may facilitate sequential access to individual cells of the memory array 22. To facilitate this functionality, the command decoder 26 includes a command controller 28 that includes one or more individual controllers to control the address sequencing when a particular mode command (e.g., Fast Zero command) is received. Further, in order to generate internal addresses to be accessed sequentially, one or more counters 30 may also be provided. Because additional counters 30 may increase the cost and/or size of the memory device 14, it may be advantageous, in some embodiments of the Fast Zero mode, to share the same counters 30 with other modes of operation to minimize the additional hardware used to generate the address sequencing to access the memory array 22. It should be noted that while the command controller 28 and counters 30 are illustrated as being part of the command decoder 26, alternatively, these elements may be provided elsewhere on the memory device 14.

Figure 2:
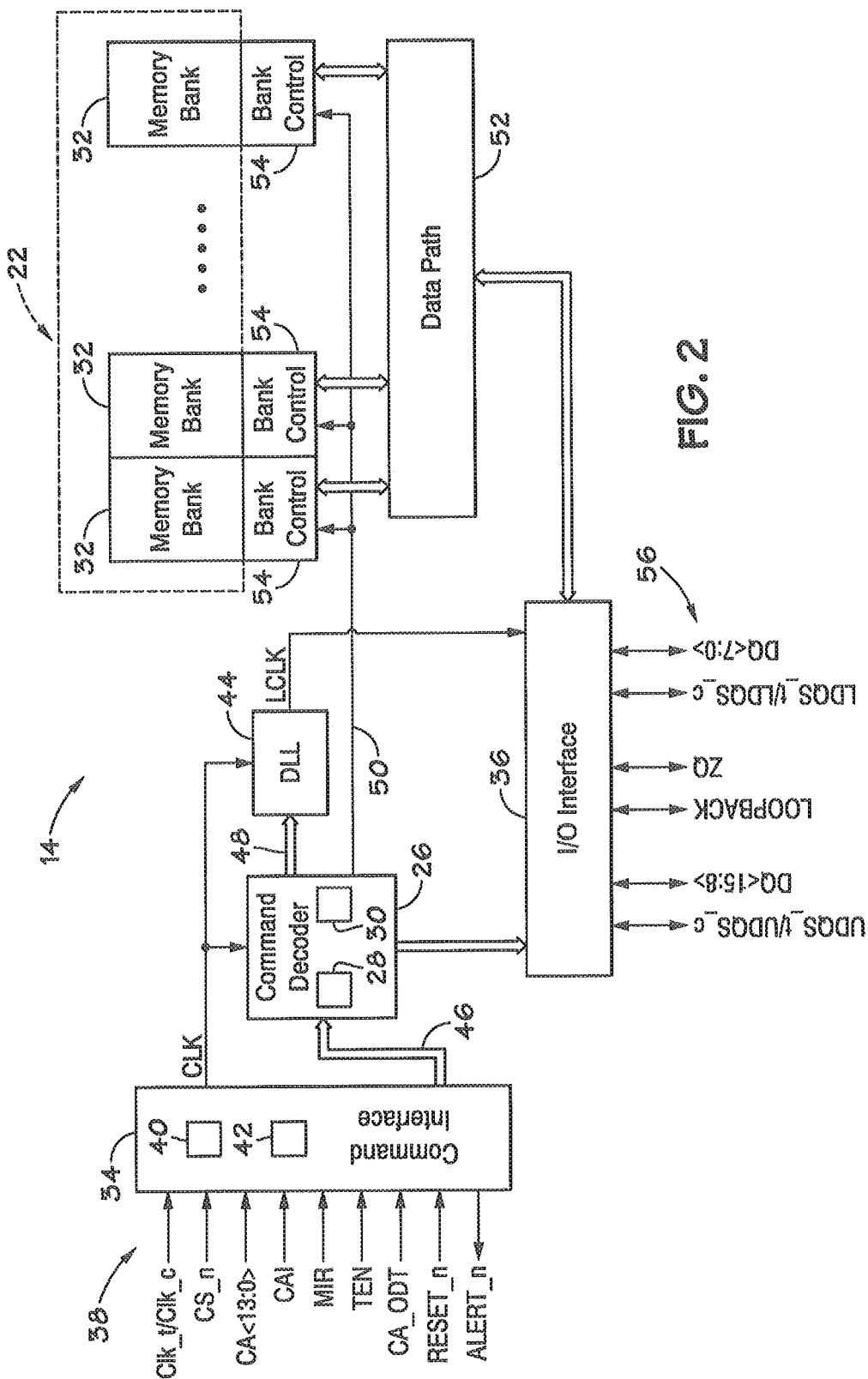
FIG. 2 is a block diagram illustrating a memory device, in accordance with an embodiment of the present disclosure.

The block diagram of FIG. 2 is a functional block diagram illustrating certain additional features and related functionality of the memory device 14. In accordance with one embodiment, the memory device 14 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 14, may include a memory array 22 logically and functionally grouped into a number of memory banks 32. The memory banks 32 may be DDR5 SDRAM memory banks, for instance. The memory banks 32 may be provided on one or more chips (e.g., SDRAM chips) that are arranged on dual inline memory modules (DIMMS). Each DIMM may include a number of SDRAM memory chips (e.g., x8 or x16 memory chips). Each SDRAM memory chip may include one or more memory banks 32. The memory device 14 represents a portion of a single memory chip (e.g., SDRAM chip) having a number of memory banks 32. For DDR5, the memory banks 32 may be further arranged to form bank groups. For instance, for an 8 gigabit (Gb) DDR5 SDRAM, the memory chip may include 16 memory banks 32, arranged into 8 bank groups, each bank group including 2 memory banks. For a 16 Gb DDR5 SDRAM, the memory chip may include 32 memory banks 32, arranged into 8 bank groups, each bank group including 4 memory banks, for instance. Various other configurations, organization and sizes of the memory banks 32 on the memory device 14 may be utilized depending on the application and design of the overall system.

As previously described, the memory device 14 may include a command interface 34 and an input/output (I/O) interface 36. The command interface 34 is configured to provide a number of signals (e.g., signals 38) from an external device, such as a processor 16 or controller 12. The processor 16 or controller 12 may provide various signals 38 over one or more bi-directional data buses (e.g., data bus 18) to and from the memory device 14 to facilitate the transmission and receipt of data to be written to or read from the memory device 14.

As will be appreciated, the command interface 34 may include a number of circuits, such as a clock input circuit 40 and a command address input circuit 42, for instance, to ensure proper handling of the signals 38. The command interface 34 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 40 receives the true clock signal (Clk_t) and the complementary clock signal (Clk_c) and generates an internal clock signal CLK. The internal clock signal CLK is supplied to an internal clock generator 44, such as a delay locked loop (DLL) circuit. The internal clock generator 44 generates a phase controlled internal clock signal LCLK based on the received internal clock signal CLK. The phase controlled internal clock signal LCLK is supplied to the I/O interface 36, for instance, and is used as a timing signal for determining an output timing of read data.

The internal clock signal CLK may also be provided to various other components within the memory device 14 and may be used to generate various additional internal clock signals. For instance, the internal clock signal CLK may be provided to a command decoder 26. The command decoder 26 may receive command signals from the command bus 50 and may decode the command signals to provide various internal commands. For instance, the command decoder 26 may provide command signals to the internal clock generator 44 over the bus 48 to coordinate generation of the phase controlled internal clock signal LCLK. The phase controlled internal clock signal LCLK may be used to clock data through the I/O interface 36, for instance.

Further, the command decoder 26 may decode commands, such as read commands, write commands, activate commands, mode-register set commands (e.g., Fast Zero commands, ECS commands, etc.), and provide access to a particular memory bank 32 corresponding to the command, via the bus path 52. As will be appreciated, the memory device 14 may include various other decoders, such as row decoders and column decoders, to facilitate access to the memory banks 32. In one embodiment, each memory bank 32 includes a bank control block 54 which provides the necessary decoding (e.g., row decoder and column decoder), as well as other features, such as timing control and data control, to facilitate the execution of commands to and from the memory banks 32.

As previously described with regard to FIG. 1, the command decoder 26 may include one or more command controllers 28 to facilitate certain functions, such as implementation of the Fast Zero mode. In addition, the command decoder 26 may include one or more counters 30 that may be utilized under control of the command controller(s) 28 to generate internal addresses for sequential access of cells of the individual storage locations within each memory bank 32.

The memory device 14 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 34 using the clock signals (Clk_t and Clk_c). The command interface 34 may include a command address input circuit 42 which is configured to receive and transmit the commands to provide access to the memory banks 32, through the command decoder 26, for instance. In addition, the command interface 34 may receive a chip select signal (CS_n). The CS_n signal enables the memory device 14 to process commands on the incoming CA<13:0> bus. Access to specific banks 32 within the memory device 14 is encoded on the CA<13:0> bus with the commands.

In addition, the command interface 34 may be configured to receive a number of other command signals. For instance, a command/address on die termination (CA_ODT) signal may be provided to facilitate proper impedance matching within the memory device 14. A reset command (RESET_n) may be used to reset the command interface 34, status registers, state machines and the like, during power-up for instance. The command interface 34 may also receive a command/address invert (CAI) signal which may be provided to invert the state of command/address signals CA<13:0> on the command/address bus, for instance, depending on the command/address routing for the particular memory device 14. A mirror (MIR) signal may also be provided to facilitate a mirror function. The MIR signal may be used to multiplex signals so that they can be swapped for enabling certain routing of signals to the memory device 14, based on the configuration of multiple memory devices in a particular application. Various signals to facilitate testing of the memory device 14, such as the test enable (TEN) signal, may be provided, as well. For instance, the TEN signal may be used to place the memory device 14 into a test mode for connectivity testing.

The command interface 34 may also be used to provide an alert signal (ALERT_n) to the system processor or controller for certain errors that may be detected. For instance, an alert signal (ALERT_n) may be transmitted from the memory device 14 if a cyclic redundancy check (CRC) error is detected. Other alert signals may also be generated. Further, the bus and pin for transmitting the alert signal (ALERT_n) from the memory device 14 may be used as an input pin during certain operations, such as the connectivity test mode executed using the TEN signal, as described above.

Data may be sent to and from the memory device 14, utilizing the command and clocking signals discussed above, by transmitting and receiving data signals 56 through the I/O interface 36. More specifically, the data may be sent to or retrieved from the memory banks 32 over the data path 52, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 14, certain memory devices, such as DDR memory devices may utilize data strobe signals, generally referred to as DQS signals. The DQS signals are driven by the external processor or controller sending the data (e.g., for a write command) or by the memory device 14 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 14, for instance.

An impedance (ZQ) calibration signal may also be provided to the memory device 14 through the I/O interface 36. The ZQ calibration signal may be provided to a reference pin and used to tune output drivers and ODT values by adjusting pull-up and pull-down resistors of the memory device 14 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 14 and GND/VSS external to the memory device 14. This resistor acts as a reference for adjusting internal ODT and drive strength of the IO pins.

In addition, a loopback signal (LOOPBACK) may be provided to the memory device 14 through the I/O interface 36. The loopback signal may be used during a test or debugging phase to set the memory device 14 into a mode wherein signals are looped back through the memory device 14 through the same pin. For instance, the loopback signal may be used to set the memory device 14 to test the data output (DQ) of the memory device 14. Loopback may include both a data and a strobe or possibly just a data pin. This is generally intended to be used to monitor the data captured by the memory device 14 at the I/O interface 36.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 14), etc., may also be incorporated into the memory system 10. Accordingly, it should be understood that the block diagram of FIG. 2 is only provided to highlight certain functional features of the memory device 14 to aid in the subsequent detailed description.

Figure 3:
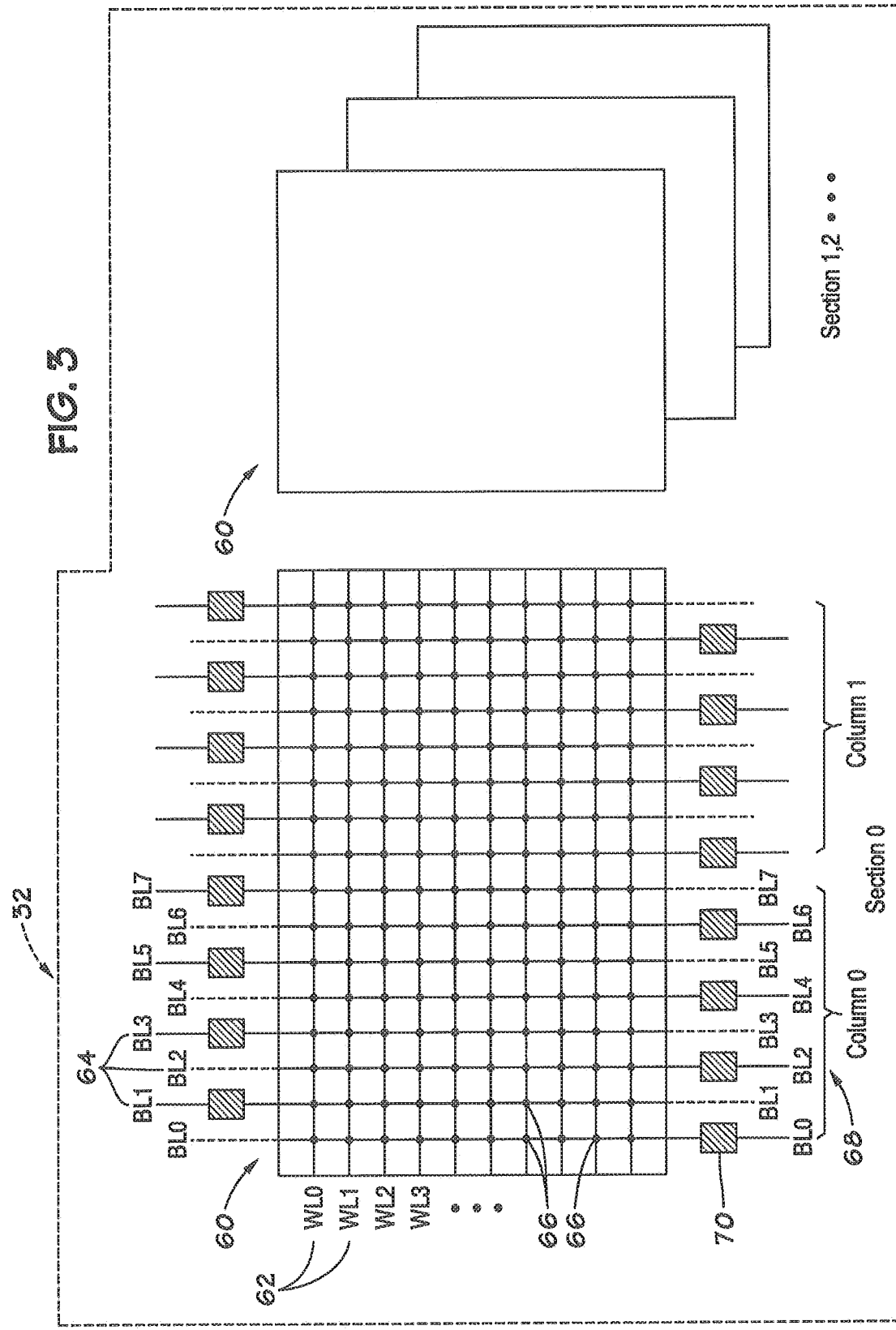
FIG. 3 is a schematic diagram of a portion of the memory device of FIG. 2, in accordance with an embodiment of the present disclosure.

In some embodiments, the memory banks 32 may be divided into one or more sections 60, as shown in FIG. 3. Each section 60 may include a grid of multiple wordlines 62, also known as rows, and bitlines 64, also known as digit lines. The intersection of a wordline 62 and a bitline 64 may then yield an individual memory cell 66 to store a single bit of data. Although logical data (e.g., 1s and 0s) are stored in each memory cell 66 defined by wordlines 62 and bitlines 64, to access the memory cells, each wordline 62 and bitline 64 may be assigned an address. Addresses within a section 60 may include a row address and a columns address. While a row address may include only one row/wordline 62, a column address may include multiple columns 68, which, in turn, may also include multiple bitlines 64. For example, a column 68 may include eight bitlines 64, and a single column address may access sixteen columns 68. As such, 128 memory cells 66 (1×(8×16)) may be identified by the same row and column address. This may be referred to as 16$n$ pre-fetch because sixteen columns 68 may be called upon by single column address. In some embodiments each column 68 may have more or fewer bitlines 64. For example, in one embodiment, each column includes one bitline 64. In such a case, columns 68 and bitlines 64 may be one and the same. Furthermore, in some embodiments, a single column address may access just one column. Therefore, each row and column address may be associated with a single memory cell 66. Although depicted in FIG. 3 with only ten wordlines 62 and two columns 68, as will be appreciated, a section 60 may have any number of rows 62 and columns 68 depending on the application and design of the overall system.

On each bitline 64, a sense amplifier 70 may be used to determine the logical state of a memory cell 66. For example, when a bitline 64 is activated, along with a corresponding wordline 62, the logical state of a memory cell 66 may be read by the sense amplifier 70. The sense amplifier 70 may then compare the read value to a reference value, amplify the difference between the two, and output the determined value of the memory cell 66. As such, the sense amplifier 70 may draw power from a power supply to amplify and hold the read value. Additionally, as illustrated, the sense amplifiers 70 for each bitline 64 may be located physically on alternating sides of the section 60. However, in other embodiments, the sense amplifiers 70 may be located on the same side of the section 60 or elsewhere depending on the application and design of the memory device 14.

Figure 4:
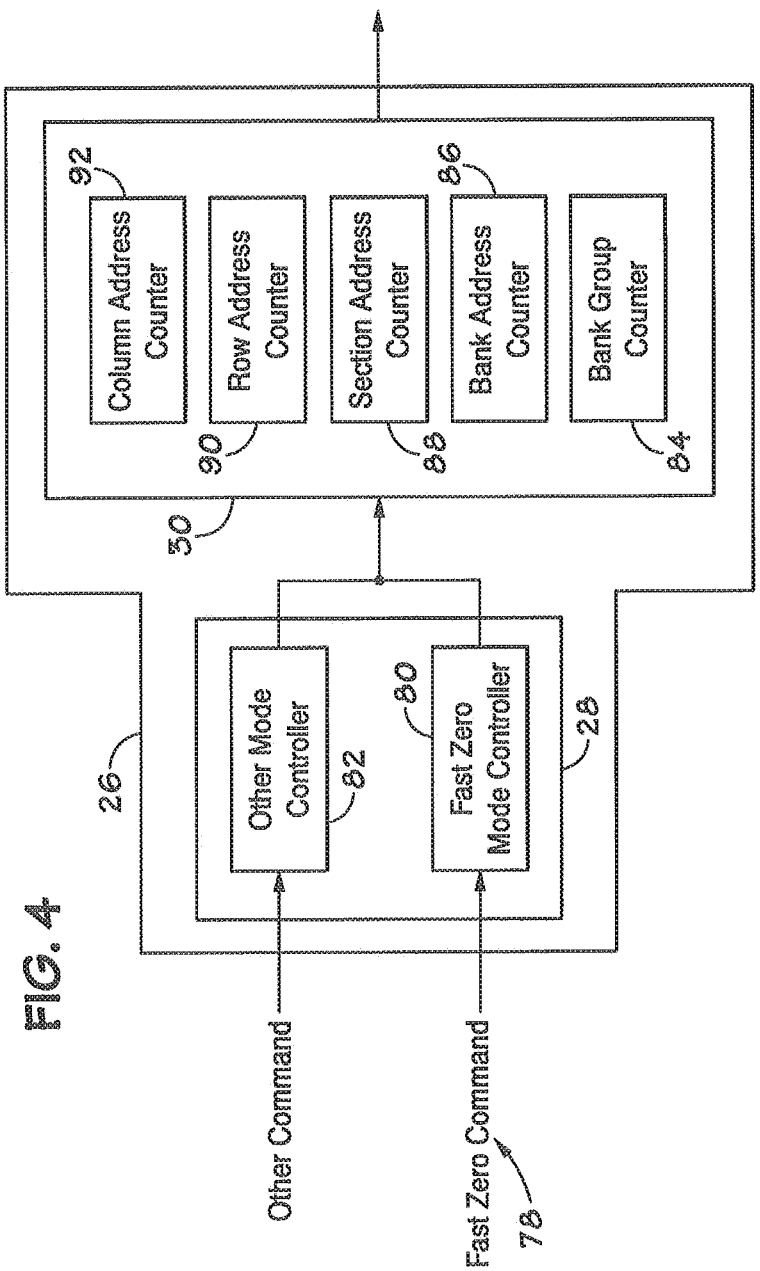
FIG. 4 is a block diagram of a portion of the memory device of FIG. 2, in accordance with an embodiment of the present disclosure.

When implementing the Fast Zero mode, logical 0s may be written to every memory cell 66 of the memory array 22. To facilitate accessing the multiple wordlines 62 and bitlines 64, the command decoder 26 may include a command controller 28 to receive a Fast Zero command 78, as illustrated in FIG. 4. The command controller 28 may include one or more individual controllers 80 and 82 to control the address sequencing when a particular mode command (e.g., Fast Zero command) is received. In the illustrated embodiment, the command controller 28 includes a Fast Zero mode controller 80 and a secondary other mode controller 82. The Fast Zero mode controller 80 may be implemented alone or in conjunction with multiple other mode controllers. The other mode controller 82 may provide control for one or more additional modes of operation that may be used in the memory device 14, depending on the application.

The Fast Zero command 78 may be asserted by one of the processors 16 in the external controller 12 as part of the device power-up and initialization sequence, for instance. Additionally or alternatively, the Fast Zero mode may be employed as part of an error-correcting code (ECC) implementation. As will be appreciated, a Fast Zero command 78 may be sent at any appropriate time when the writing of 0s to the memory array 22 is desired. Additionally, while the Fast Zero mode of operation is utilized to write logical 0s to multiple memory locations, a similar mode register command may also be used to write other known values to each of the memory locations (e.g., all logical 1s, or a specified and known pattern).

Furthermore, the use of the Fast Zero mode to write logical 0s to all or a portion of the memory array 22 may be significantly faster than a standard write via the I/O interface 36. For example, a standard access to a memory cell 66 may include both read and/or write steps. However, when employing the Fast Zero mode, the read step may be skipped, thus shortening the process time and optimizing system resources (e.g., time). Generally, 0s may be written as regular data, cell-by-cell from incoming data on the I/O interface 36. Thus, writing 0s across the entire memory array 22 may be relatively time consuming, especially for large capacity memory devices 14. However, the Fast Zero mode may allow 0s, or another data pattern, to be repeated internally, using the counters 30 to quickly access and write to each cell, and, therefore, not utilize incoming data on the I/O interface 36 and/or data path 52 for each write. As such, during the Fast Zero mode, the I/O interface 36 and/or data path 52 may be omitted from the write process, or its use minimized.

During the Fast Zero mode, internal memory addresses may be sequentially incremented by counters 30 to access the multiple memory cells 66. In accordance with one embodiment, the counters 30 may include a bank group counter 84, a bank address counter 86, a section address counter 88, a row address counter 90, and a column address counter 92.

In the illustrated embodiment, five counters 30 are provided in order to facilitate the various groupings of memory cells 66 for sequential access. Specifically, a bank group counter 84 is provided to switch from one bank group to another during sequential accessing of the memory array 22. In one embodiment, the memory array 22 may include four bank groups and the bank group counter 84 is a 2-bit counter. A bank address counter 86 may also be provided to switch from one bank to another during access of the memory array 22. In one embodiment, the memory array 22 may include two or four memory banks 32 per one bank group and the bank address counter 86 is a 1-bit or 2-bit counter. In one embodiment, a section address counter 88 may also be implemented to provide switching between sections 60 of a memory bank 32. In one embodiment, each memory bank may include eight sections and the section address counter is a 3-bit counter. A row address counter 90 may also be provided to switch from one wordline 62 to another during sequential accessing of the memory array 22. In one embodiment, the memory array 22 may include 65,536 wordlines and the row address counter 90 is a 16-bit counter. Finally, in the illustrated embodiment, a column address counter 92 may also be provided to switch from one set of column 68 to another during sequential accessing of the memory array 22. In one embodiment, the memory array 22 may include 128 column addresses and the column address counter 92 is a 7-bit counter. In certain embodiments of the memory device 14, it may be that not all of the illustrated counters 30 are utilized. For instance, certain memory devices 14 may only employ one bank group. In such a device, the bank group counter 84 may not be utilized or may be omitted entirely from the memory device 14. Further, in certain embodiment of the memory device 14, additional counters 30 may be employed if other groupings of memory cells 66 are utilized.

Figure 5:
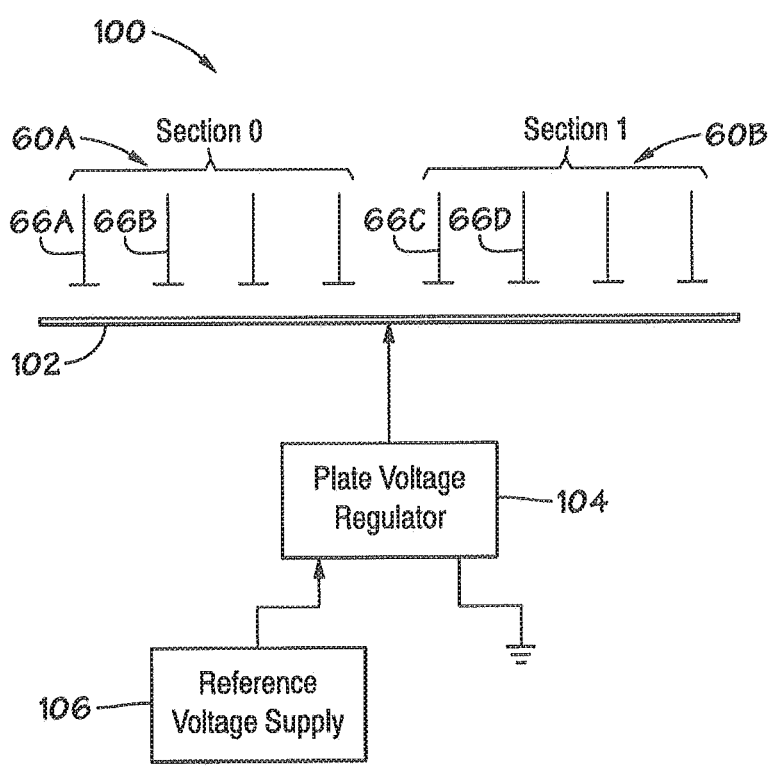
FIG. 5 is schematic diagram of a portion of the memory device of FIG. 2, in accordance with an embodiment of the present disclosure.

When writing to the memory cells 66, current may be sinked or sourced, and each memory cell 66 may function as or as a part of a capacitor 100, as shown in FIG. 5, to store the logical data (e.g., a logical 0 or 1). Furthermore, multiple memory cells 66 may be implemented using a common capacitor plate 102. In some embodiments, a single capacitor plate 102 may be utilized by multiple sections 60. Additionally, each memory bank 32 may include one or more capacitor plates 102. Each of the memory cells 66A, 66B, 66C, and 66D may be imparted a voltage based on the logical data written to it. For example, in a standard polarity (i.e., non-inverted) section 60A, a logical 0 may be written to a memory cell 66A by driving the voltage on the memory cell 66A to 0V, also known as a physical 0. Alternatively, if a logical 1 is to be written, the memory cell 66A may be driven to a reference voltage level (e.g., 1V, 1.15V, 1.5V, etc.), also known as a physical 1. The reference voltage may vary depending on the implementation of the memory device 14, and/or may be set via the controller 12. In one embodiment, some sections 60 may have an inverted polarity. In such a case, a memory cell 66C of an inverted section 60B may be written with a logical 0 by driving the voltage up to the reference voltage (i.e., a physical 1), and a logical 1 may be written by driving the voltage down to 0 V (i.e., a physical 0).

Although each memory cell 66 may be afforded either 0V or a reference voltage depending on the logical state, the capacitor plate 102, shared by the multiple memory cells 66, may be maintained at a voltage between 0V and the reference voltage. For example, the plate voltage may be half of the reference voltage. The plate voltage of the capacitor plate 102 may be maintained by one or more plate voltage regulators 104 (e.g., push-pull amplifiers) coupled to a low voltage reference (e.g., ground) and a reference voltage supply 106. The plate voltage regulators 104 may pull up or pull down the plate voltage to maintain half of the reference voltage. In some embodiments, the Fast Zero mode may employ dedicated plate voltage regulators 104 to facilitate the rapid writing of logical data to the memory cells 66. In one such embodiment, the plate voltage regulators 104 may not be connected to the reference voltage supply 106 until the Fast Zero mode has been enabled. Additionally, bleeders (e.g., bleeder resistors) may be used during power up of the plate voltage regulators 104 to create a small current demand at the isolated plate voltage regulators 104. This may serve to stabilize and/or reduce oscillation of the output as the plate voltage regulators 104 are powered up. The bleeders may then be turned off (e.g., disconnected) once power up is complete. As such, there may be a delay at the beginning of the Fast Zero mode while the voltage plate regulators 104 are powered up before writing.

When writing logical data to a memory cell 66, the plate voltage may react to the voltage driven to the memory cell 66. For example, when the voltage of a memory cell 66 is driven from the reference voltage to 0V, the plate voltage may couple down and demand a pull up from the plate voltage regulator 104. Because Fast Zero mode may include writing multiple logical 0s very quickly, the current demand on the plate voltage regulator 104 may be very high. In one embodiment, normal write operations may draw less than or about 1 milliamp (mA). However, during Fast Zero mode, this current demand may be many times greater. By sequencing the write operations to alternate between sections 60 of opposite polarity, the current demand may be reduced.

Figure 6:
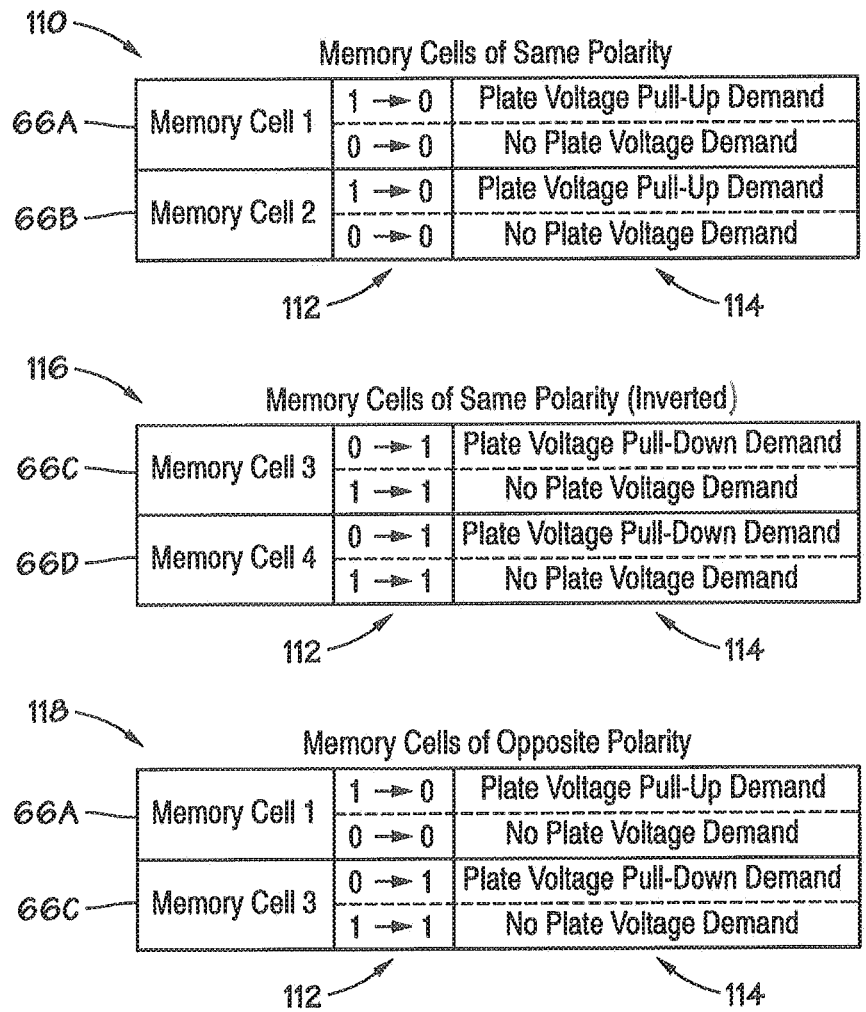
FIG. 6 is an example diagram of voltage demands in response to writing data to memory cells, in accordance with an embodiment of the present disclosure.
Figure 7:
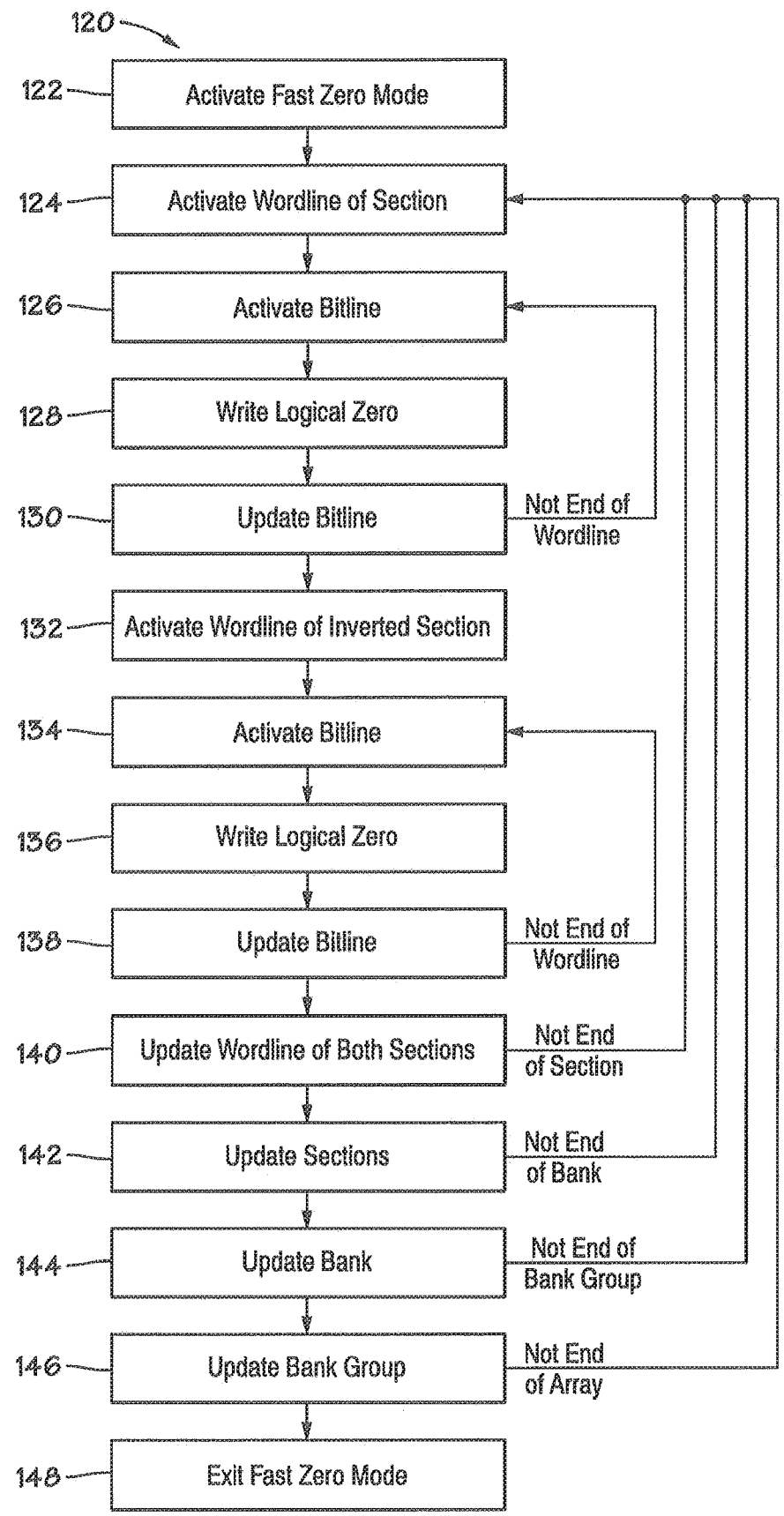
FIG. 7 is a flowchart illustrating a Fast Zero mode of operation, in accordance with another embodiment of the present disclosure.

As discussed above, when implementing the Fast Zero mode, the Fast Zero controller 80 may control the counters 30 to sequence through the multiple wordlines 62 and bitlines 64. The example diagram 110 of FIG. 6 shows the physical change 112 (e.g., a physical 1 to a physical 0) of memory cells 66A and 66B of the same polarity, and the associated plate voltage demand 114. Similarly, example diagram 116 shows the physical change 112 of memory cells 66C and 66D of the same inverted polarity, and the associated plate voltage demand 114. Additionally, example diagram 118 shows the physical change 112 of memory cells 66A and 66C of the opposite polarity, and the associated plate voltage demand 114.

In the illustrated embodiment, when a memory cell 66A of a standard polarity section 60A changes from a physical 1 to a physical 0, the plate voltage may be coupled down, and, therefore, may incur a voltage pull-up demand. If the memory cell 66A is already set at a physical 0, it may be that no voltage demand is incurred by the capacitor plate 102. Likewise if a memory cell 66C of an inverted section 60B changes from a physical 0 to a physical 1, the plate voltage may be coupled up, and, therefore, may incur a voltage pull-down demand. If the memory cell 66C is already a physical 1, there may be no voltage demand incurred by the capacitor plate 102. The previous physical state of a memory cell 66 may be known or unknown. In some situations, the previous physical states of the multiple memory cells 66 of the memory array 22 may be random. Thus, statistically, around half of the memory cells 66 may be physical 1s and the rest physical 0s.

During the Fast Zero mode, one or more wordlines 62 of a section may be activated and written with logical 0s. To facilitate this, one or more bitlines 64 may be activated simultaneously and cycled through until the end of the wordline(s) 62 is reached. Once the end of the wordline(s) 62 is reached, a next set of one or more wordlines 62 may be activated and the process is repeated. In one embodiment, the wordlines 62 may be sequenced such that the wordlines 62 of the same section 60 are cycled through before moving on to another section 60. In this instance, the memory cells 66 of the wordlines 62 are of the same section 60, and therefore have the same polarity. As shown in example diagram 110, when multiple memory cells 66A and 66B of the same standard polarity are written to logical zero (i.e. physical 0) a voltage pull-up demand may be incurred by the capacitor plate 102 if the previous physical state was 1. As stated above, in some instances, about half of the memory cells 66 of the given section 60A may have a previous physical state of 1. As such, in the statistical average, for every two memory cells 66A and 66B the plate voltage may incur one unit of voltage pull-up demand to be provided by the plate voltage regulator 104. However, in some scenarios, the majority or all of the previous physical states may be 1. In such a "worst-case scenario," for every two memory cells 66A and 66B the plate voltage may incur two units of voltage pull-up demand. If the time between voltage demands is short enough, the pull-up and/or pull-down demands may combine to increase or decrease the current demand of the capacitor plate 102. When cycling through an entire section 60A of memory cells 66 at the increased rate of the Fast Zero mode, the current demand in this worst-case scenario may be much higher (e.g., 20 mA, 25 mA, etc.) than that of normal write operations. Likewise, as shown by example diagram 118, if an inverted section 60B is cycled through, the memory cells 66C and 66D are still of the same polarity, and the average plate voltage demand for two memory cells 66C and 66D may be one unit of voltage pull-down demand. Furthermore, the worst-case scenario may be two units of voltage pull-down demand to be rectified by the plate voltage regulator 104.

In another embodiment, one or more wordlines 62 of a section 60A may be written with logical 0s, and, subsequently or simultaneously, one or more wordlines 62 of an inverted section 60B may be written with logical 0s. As shown by example diagram 118, memory cells 66A and 66C may have offsetting voltage demands 114. For example, in the statistical average, a quarter of the memory cells 66 of the combined sections 60A and 60B may incur a voltage pull-up demand, a quarter may incur a voltage pull-down demand, and half may incur no voltage demand. As such, the voltage demands may cancel each other out. In the worst-case scenario, one section 60 does not need any corrections to the physical state while the other requires all memory cells 66 to be changed. However, when using this method of employing sections 60 of opposite polarity, the worst-case scenario current draw may be less than (e.g., half) that when using sections 60 of the same polarity.

Flowchart 120 illustrates an example implementation of the Fast Zero mode that alternates between sections 60 of opposite polarity. The Fast Zero mode controller 80 may first receive a Fast Zero command 78 (process block 122). Upon receipt of the Fast Zero command 78, the Fast Zero mode controller 80 may issue an activate command to a wordline 62 of a section 60 (process block 124). Multiple (e.g., four) wordlines 62 may be activated simultaneously to further reduce overall process time. Additionally, at least one bitline 64 may be activated to access one or more memory cells 66 (process block 126). Multiple bitlines 64, columns 68, and/or column addresses may activated simultaneously to further reduce overall process time. After activating at least one wordline 62, along with at least one bitline 64, a logical 0 may be written to a memory cell 66 (process block 128). After writing a logical 0 to a memory cell 66 of the activated wordline(s) 62 the bitline(s) 64 may be updated, for example, by progressing to a subsequent column address (process block 130). The Fast Zero mode controller 80 and the column address counter 92 may be utilized to sequentially step through the bitlines 64 of the activated wordline(s) 62. When finished, activated wordline(s) 62 may be pre-charged to deactivate them. After sequencing through the bitlines 64, a wordline 62 of a section 60 with the opposite polarity and utilizing the same capacitor plate 102 as the first section 60 may be activated (process block 132). As before, the bitlines 64 may be activated (process block 134), logical 0s may be written (process block 136), and the bitlines 64 may be updated (process block 138) until end of the wordline(s) 62 is reached. Activation of and writing to the wordlines 62 of each section 60 may done in an alternating manner such as described above, or wordlines 62 of both sections may be written simultaneously. The wordlines 62 of both sections 60 may be updated until the end of the sections 60 are reached (process block 140).

At the end of the sections 60, the section address counter 88 may update to subsequent sections 60 until the end of the bank 32 is reached (process block 142). At the end of the bank 32, the bank address counter 86 may update to a subsequent bank 32 until the end of the bank group (process block 144). At the end of the bank group, the bank group counter 84 may update to a subsequent bank group until the end of the memory array 22 (process block 146). Once the end of the memory array 22 has been reached or all of the desired memory cells 66 have been written, the Fast Zero mode may then be exited (process block 148).

Although the flowchart 120 is depicted in a particular order, in certain embodiments, steps may be reordered, altered, deleted, repeated, and/or occur simultaneously. Additionally, in some embodiments, multiple wordlines 62, bitlines 64, columns 68, sections 60, memory banks 32, and/or bank groups may be activated and written to simultaneously. For example, the first wordline 62 of the first section 60 of all memory banks 32 may be written to simultaneously. In some embodiments, each memory bank 32 may be activated and written to in parallel and, thus, neither a bank group counter 84 nor the bank address counter 86 need be incremented.

As described above, certain modes of operation, such as the Fast Zero mode, may facilitate sequential access and writing of logical 0s to individual memory cells 66 of a memory array 22. In doing so, the voltage demand to maintain the plate voltage of the capacitor plate 102 may cause a high current demand from the plate voltage regulator 104. To reduce the current demand, the Fast Zero mode may employ counters 30 to alternate writes of wordlines 62 between sections 60 of opposite polarity. In using this method, the worst-case scenario current demand may be halved, and the statistical average current demand may partially or fully negated.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory array comprising at least two sections, wherein each of the at least two sections comprises a plurality of memory cells, wherein the plurality of memory cells comprises volatile memory cells; and
one or more controllers configured to receive one or more commands to initiate writing logical data to the plurality of memory cells of a first section of the at least two sections and the plurality of memory cells of a second section of the at least two sections, wherein the one or more controllers is configured to initiate the writing to alternate between the first section and the second section such that a first portion of the first section is written with the logical data before a second portion of the second section and the second portion of the second section is written with the logical data before a third portion of the first section until the first section and second section have been entirely written with the logical data.

2. The memory device of claim 1, wherein the first section and the second section are configured to have opposite polarities.

3. The memory device of claim 1, wherein when a first set of one or more wordlines of the first section is activated, a first plurality of bitlines is configured to be activated and deactivated in sequence until a first end of the first set of one or more wordlines and when a second set of one or more wordlines of the second section is activated, a second plurality of bitlines is configured to be activated and deactivated in sequence until a second end of the second set of one or more wordlines to facilitate the writing of the logical data to the plurality of memory cells.

4. The memory device of claim 3, wherein the first set of one or more wordlines is configured to be written with the logical data before the second set of one or more wordlines is written with the logical data.

5. The memory device of claim 3, wherein the first set of one or more wordlines is configured to be written with the logical data simultaneously with the second set of one or more wordlines.

6. The memory device of claim 3, wherein writing to the first section causes a first voltage demand, and writing to the second section causes a second voltage demand, wherein the first voltage demand is negated, at least partially, by the second voltage demand.

7. The memory device of claim 1, wherein the one or more commands comprises a Fast Zero command to enter a Fast Zero mode.

8. The memory device of claim 1, comprising one or more plate voltage regulators configured to respond to voltage demands caused by the writing of the logical data.

9. The memory device of claim 8, wherein the one or more plate voltage regulators are dedicated for use in a Fast Zero mode.

10. The memory device of claim 1, wherein the logical data comprises only logical 0s.

11. The memory device of claim 1, comprising one or more counters configured to generate internal memory addresses to sequentially access the plurality of memory cells to facilitate writing the logical data to the memory array.

12. The memory device of claim 11, wherein the one or more counters comprise a column address counter and a row address counter.

13. The memory device of claim 11, wherein the one or more counters comprise a section address counter.

14. The memory device of claim 1, wherein the memory device writes logical data to the memory array without receiving the logical data from an input/output interface.

15. The memory device of claim 1, wherein the memory device comprises a double data rate type five synchronous dynamic random access memory (DDR5 SDRAM).

16. A method comprising:
activating a first wordline of a first plurality of wordlines of a first section of a memory device;
activating a second wordline of a second plurality of wordlines of a second section of the memory device, wherein the second section is of opposite polarity to the first section, and wherein the first section and the second section share a capacitor plate; and
writing logical zero to the first wordline and the second wordline simultaneously such that a first voltage demand on the capacitor plate caused by writing logical zero to the first wordline cancels, in a statistical aggregate, a second voltage demand on the capacitor plate caused by writing logical zero to the second wordline.

17. The method of claim 16, comprising:
sequentially accessing each of the first plurality of wordlines and the second plurality of wordlines; and
writing logical zero to each of the first plurality of wordlines and the second plurality of wordlines, wherein each wordline of the first plurality of wordlines is written simultaneously with a corresponding wordline of the second plurality of wordlines.

18. The method of claim 17, wherein sequentially accessing each of the first plurality of wordlines and the second plurality of wordlines comprises cycling, via one or more counters, through a plurality of memory addresses corresponding to first plurality of wordlines and the second plurality of wordlines.

19. The method of claim 16, comprising pre-charging each wordline of the first plurality of wordlines after the first section has been written with logical zero.

20. The method of claim 16, comprising receiving a command to initiate writing logical zero to all memory cells of the memory device.

21. A method comprising:
accessing a first plurality of wordlines of a first section of a memory device;
accessing a second plurality of wordlines of a second section of the memory device, wherein the first section and the second section are of opposite polarity; and
writing logical zero to the first plurality of wordlines and the second plurality of wordlines, wherein writing logical zero to the first plurality of wordlines and the second plurality of wordlines comprises alternating writing between the first plurality of wordlines and the second plurality of wordlines such that a first portion of the first plurality of wordlines is written to logical zero before a second portion of the second plurality of wordlines and the second plurality of wordlines is written to logical zero before a third portion of the first plurality of wordlines.

22. The method of claim 21, wherein the first portion of the first plurality of wordlines comprises two or more wordlines.

23. The method of claim 21, comprising receiving a command to initiate writing logical zero to all memory cells of the memory device.

24. The method of claim 21, wherein writing logical zero to the first plurality of wordlines and the second plurality of wordlines comprises cycling through a plurality of column addresses to access memory cells of the first plurality of wordlines and the second plurality of wordlines.

\* \* \* \* \*